US011996830B2

(12) United States Patent
Murthy et al.

(10) Patent No.: US 11,996,830 B2
(45) Date of Patent: May 28, 2024

(54) POWER SWITCH REVERSE CURRENT PROTECTION SYSTEMS

(71) Applicant: TEXAS INSTRUMENTS INCORPORATED, Dallas, TX (US)

(72) Inventors: Kushal D. Murthy, Bengaluru (IN); Subrato Roy, Bangalore (IN); Dilip Kumar Jain, Bengaluru (IN); Abhijeet Gopal Godbole, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 190 days.

(21) Appl. No.: 17/514,968

(22) Filed: Oct. 29, 2021

(65) Prior Publication Data

US 2022/0352885 A1 Nov. 3, 2022

(30) Foreign Application Priority Data

Mar. 31, 2021 (IN) .............................. 202141014731
May 12, 2021 (IN) .............................. 202141021460

(51) Int. Cl.
| | |
|---|---|
| *H03K 17/08* | (2006.01) |
| *G01R 19/165* | (2006.01) |
| *G05F 3/18* | (2006.01) |
| *H02H 3/18* | (2006.01) |
| *H03K 17/0812* | (2006.01) |
| *H03K 17/687* | (2006.01) |

(52) U.S. Cl.
CPC . *H03K 17/08122* (2013.01); *G01R 19/16538* (2013.01); *G05F 3/18* (2013.01); *H02H 3/18* (2013.01); *H03K 17/687* (2013.01)

(58) Field of Classification Search
CPC ............. H03K 17/08; H03K 17/08122; H03K 17/687; H03H 3/18; H03H 3/20; G01R 19/16538; G01R 19/16566
USPC ........................................ 361/82, 84, 86, 87
See application file for complete search history.

(56) References Cited

U.S. PATENT DOCUMENTS 9,142,951 B2 * 9/2015 Pavlin ................. H01L 27/0251

* cited by examiner

*Primary Examiner* — Hai L Nguyen
(74) *Attorney, Agent, or Firm* — Ray A. King; Frank D. Cimino

(57) ABSTRACT

One example described herein includes a power switch control system. The system includes a first monitoring terminal coupled to a first terminal of a power transistor and a second monitoring terminal coupled to a second terminal of the power transistor. The power transistor and the power switch control system can form an ideal diode between the first monitoring terminal arranged as an anode and the second monitoring terminal arranged as a cathode. The system further includes a reverse current controller coupled to the first monitoring terminal and the second monitoring terminal and is configured to control activation of the power transistor to conduct a reverse current from the second monitoring terminal to the first monitoring terminal in response to a reverse voltage arranged as a cathode voltage at the second monitoring terminal being greater than an anode voltage at the first monitoring terminal.

18 Claims, 2 Drawing Sheets

POWER SWITCH REVERSE CURRENT PROTECTION SYSTEMS

CROSS REFERENCE TO RELATED APPLICATIONS

This application claims priority to Indian Provisional Patent Application No. 202141021460, filed 12 May 2021, and from Indian Provisional Patent Application No. 202141014731, filed 31 Mar. 2021, which are both incorporated herein by reference in their entirety.

TECHNICAL FIELD

This description relates generally to electronic circuits, and more particularly to power switch reverse current protection systems.

BACKGROUND

Power supply systems that implement a power transistor to deliver current to a load are prevalent in a large variety of applications. Some applications implement a large transistor device to provide correspondingly large current to a load. One such application is for automotive electronic systems. In such power supply systems, the load is typically provided in an output stage that includes some reactive circuit components, such as an inductor. In response to certain conditions, the reactive components can provide a large reverse voltage across the power transistor, which can be exhibited as a large reverse current. The reverse current can be potentially destructive to the power transistor and/or other circuit devices in the power supply system. Some power supply systems can include devices and subcircuits that can provide some degree of protection or dissipation of the reverse current, such as a transient voltage suppressor (TVS) arranged in an input stage of the power supply system.

SUMMARY

One example described herein includes a power switch control system. The system includes a first monitoring terminal coupled to a first terminal of a power transistor and a second monitoring terminal coupled to a second terminal of the power transistor. The power transistor and the power switch control system can form an ideal diode between the first monitoring terminal arranged as an anode and the second monitoring terminal arranged as a cathode. The system further includes a reverse current controller coupled to the first monitoring terminal and the second monitoring terminal and is configured to control activation of the power transistor to conduct a reverse current from the second monitoring terminal to the first monitoring terminal in response to a reverse voltage arranged as a cathode voltage at the second monitoring terminal being greater than an anode voltage at the first monitoring terminal.

Another example described herein includes a power supply system. The system includes an input stage configured to provide a power current in response to an input voltage and an output stage configured to provide the power current to a load. The system also includes a power transistor arranged between the input stage and the output stage. The power transistor can be activated to conduct the power current from the input stage to the output stage. The system further includes a power switch control system. The power switch control system includes a first monitoring terminal coupled to a first terminal of a power transistor and a second monitoring terminal coupled to a second terminal of the power transistor. The power transistor and the power switch control system can form an ideal diode between the first monitoring terminal arranged as an anode and the second monitoring terminal arranged as a cathode. The power switch control system further includes a reverse current controller coupled to the first monitoring terminal and the second monitoring terminal and is configured to control activation of the power transistor to conduct a reverse current from the second monitoring terminal to the first monitoring terminal in response to a reverse voltage arranged as a cathode voltage at the second monitoring terminal being greater than an anode voltage at the first monitoring terminal Another example described herein includes an integrated circuit. The circuit includes a Zener diode stack having an input coupled to a first monitoring terminal and an output coupled to a second monitoring terminal. The first and second monitoring terminals can be coupled to receive a first terminal of a power transistor and a second terminal of the power transistor, respectively. The circuit also includes an anode regulation transistor device having an input coupled to the Zener diode stack, a first terminal coupled to the first monitoring terminal, and a second terminal coupled to receive an input of the power transistor. The circuit further includes a cathode regulation transistor device having an input coupled to the Zener diode stack, a first terminal coupled to receive the input of the power transistor, and a second terminal coupled to the second monitoring terminal.

DETAILED DESCRIPTION

Figure 1:
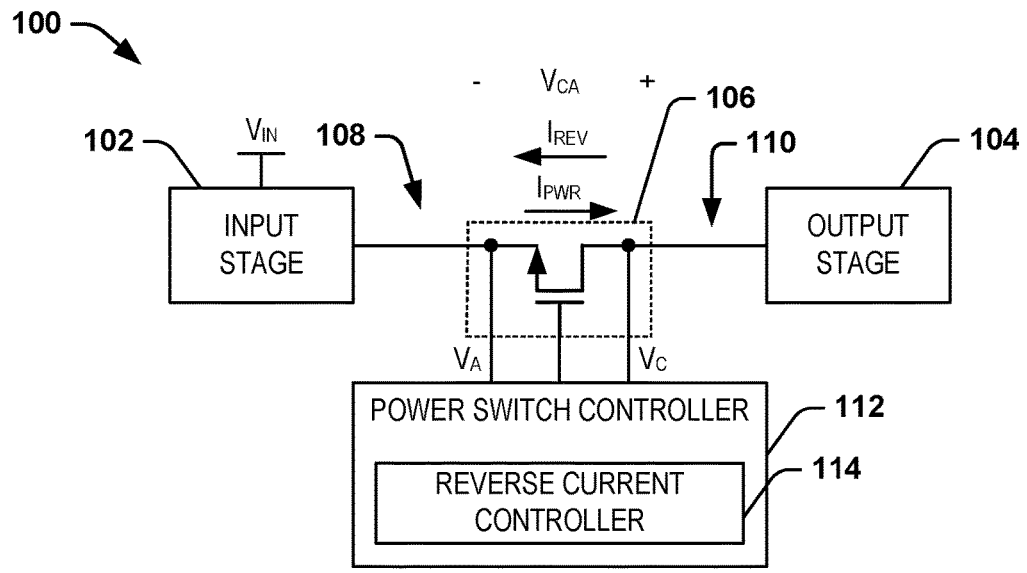
FIG. 1 is an example block diagram of a power supply system.

This description relates generally to electronic circuits, and more particularly to power switch reverse current protection systems. A power supply system can include a power switch control system that can be coupled to a gate of a power transistor, so the power switch control system can control operation of the power transistor. The power switch control system can include a reverse current controller that can provide protection against damage to the power transistor and/or other circuit components resulting from a large reverse current that can be provided through the power transistor. For example, the large reverse current can occur based on deactivation of the power transistor to cease providing current through an inductor in an output stage, thus resulting in a large and rapidly provided reverse current. As an example, the reverse current event can be modeled based on a number of known industry standards, such as the automotive standard ISO 7637 in which a large reverse voltage (e.g., approximately 150 volts) can appear across the power transistor.

As described herein, the reverse current controller can operate to clamp a reverse voltage to limit the amplitude of the reverse current through the power transistor. The reverse current controller includes a first monitoring terminal and a second monitoring terminal that are coupled to respective terminals (e.g., source and drain, respectively) of the power transistor, so the power transistor and the reverse current controller form an ideal diode in which the first monitoring terminal behaves as an anode of the ideal diode and the second monitoring terminal behaves as the cathode of the ideal diode. The reverse voltage can therefore be a reverse voltage in which the cathode voltage at the second monitoring terminal that is greater than an anode voltage at the first monitoring terminal.

The reverse current controller includes a Zener diode stack that is configured to set a particular threshold amplitude for the reverse voltage, and further includes a cathode regulation transistor device and an anode regulation transistor device that each have inputs coupled to the Zener diode stack. The input (e.g., gate) of the power transistor is arranged between the cathode regulation transistor device and the anode regulation transistor device. Therefore, in response to the reverse voltage being approximately equal to the threshold amplitude, the cathode regulation transistor device and the anode regulation transistor device can each activate to activate the power transistor, thereby conducting the reverse current from the cathode to the anode. Because the input of the power transistor is arranged between the cathode regulation transistor device, changes to either the cathode voltage or the anode voltage result in changes to activation of the power transistor to regulate the reverse current through the power transistor, thereby providing clamping of the reverse voltage. Accordingly, the clamping of the reverse voltage can limit the amplitude of the reverse current, thereby protecting the power transistor and/or the other circuit components of the power supply system. Such a clamping of the reverse voltage, and thus limiting of the reverse current, can obviate the need for other bulky current protection devices, such as a transient voltage suppressor (TVS).

As described herein, the term "activate", as describing a transistor device, refers to providing sufficient bias (e.g., gate-source voltage for a field-effect transistor (FET)) to operate the transistor device in saturation mode. Similarly, the term "deactivate", as describing a transistor device, refers to removing bias to operate the transistor device in cutoff mode.

FIG. 1 is an example block diagram of a power supply system 100. The power supply system 100 can be implemented in any of a variety of power providing applications, such as in an automotive electronics system. As described herein, the power supply system 100 can be effective in mitigating potentially destructive large reverse currents.

The power supply system 100 includes an input stage 102 that is configured to generate a power current $I_{PW}$ based on an input voltage $V_{IN}$. The power supply system 100 also includes an output stage 104 that is configured to provide the power current $I_{PW}$ to a load (not shown) via a power transistor 106, demonstrated in the example of FIG. 1 as an N-channel field-effect transistor (FET) having a source coupled to a terminal 108 that is likewise coupled to the input stage 102, and includes a drain coupled to a terminal 110 that is likewise coupled to the output stage 104. The power supply system 100 further includes a power switch control system 112 that is coupled to a gate of the power transistor 106, and is therefore configured to control operation of the power transistor 106. As an example, the power switch control system 112 can be provided in or as part of an integrated circuit (IC). As described herein, the power switch control system 112 and the power transistor 106 can be arranged to as an ideal diode, so the terminal 108 can be an anode of the ideal diode and the terminal 110 can be a cathode of the ideal diode. The terminal 108, and thus the anode, is demonstrated as having a voltage $V_A$. Similarly, the terminal 110, and thus the cathode, is demonstrated as having a voltage $V_C$.

In the example of FIG. 1, the power switch control system 112 includes a reverse current controller 114. The reverse current controller 114 is coupled to the terminal 108 and the terminal 110, so the terminals 108 and 110 can be respective first and second monitoring terminals for detecting a reverse voltage $V_{CA}$ across the power transistor 106. For example, during normal operating conditions, the power transistor 106 is periodically activated by the reverse current controller 114 to provide the power current $I_{PW}$ from the input stage 102 to the output stage 104, so the voltage $V_A$ is greater than the voltage $V_C$. However, in certain conditions (e.g., cessation of the power current $I_{PW}$ to an inductor in the output stage 104), the voltage $V_C$ can increase rapidly relative to the voltage $V_A$, causing a non-zero reverse voltage $V_{CA}$ to develop across the power transistor 106. As an example, the reverse voltage $V_{CA}$ can be very large (e.g., approximately 150 volts), such as modeled by an industry standard test (e.g., ISO 7637 for automotive industry testing). Therefore, a resulting reverse current, demonstrated as a current $I_{REV}$ in the example of FIG. 1, can flow from the output stage 104 to the input stage 102, and thus from the cathode to the anode, which can potentially damage the power transistor 106 and/or other circuit components in the input stage 102.

To mitigate damage to the power transistor 106 and/or other circuit components in the input stage 102, the reverse current controller 114 can be configured to clamp the voltage $V_{CA}$ to a particular threshold amplitude by activating the power transistor 106, thus decreasing the potential amplitude of the reverse current $I_{REV}$. As an example, the reverse current controller 114 can include a Zener diode stack that can set the threshold amplitude, and can include a pair of transistor devices that are coupled to the respective terminals 108 and 110 that each provide contributions to the control of the power transistor 106. Therefore, in response to changes to an increase in the amplitude of the voltage $V_C$ or a decrease in the amplitude of the voltage $V_A$, the pair of transistor devices can adjust the control of the power transistor 106 to adjust the amplitude of the reverse current $I_{REV}$ to maintain clamping of the voltage $V_{CA}$ at the threshold amplitude. Accordingly, the reverse current $I_{REV}$ can be maintained at an amplitude that is sufficiently low to substantially mitigate damage to the power transistor 106 and/or other circuit components in the input stage 102.

Therefore, as described herein, the power supply system 100 can exhibit sufficient protection against reverse voltage conditions across the power transistor 106 that can potentially result in damage to the circuit. As described above, by clamping the voltage $V_{CA}$ at the predetermined threshold amplitude in response to a reverse voltage condition, the reverse current $I_{REV}$ can be maintained at an amplitude that is sufficiently low to substantially mitigate damage to the power transistor 106 and/or other circuit components in the input stage 102. By shifting the reverse current protection to the reverse current controller 114 for providing activation and control of the power transistor 106 to conduct the reverse current $I_{REV}$, the power supply system 100 can obviate additional reverse current protection devices. For example, typical power supply systems can include a transient voltage suppressor (TVS) in the input stage to conduct a reverse current. However, a TVS can be very large, and can thus occupy a significant space on a circuit board (e.g., approximately 45% of the total area of the typical power supply system). Therefore, by implementing the reverse current controller 114, the power supply system 100 can be significantly more compact while providing sufficient reverse current protection.

Figure 2:
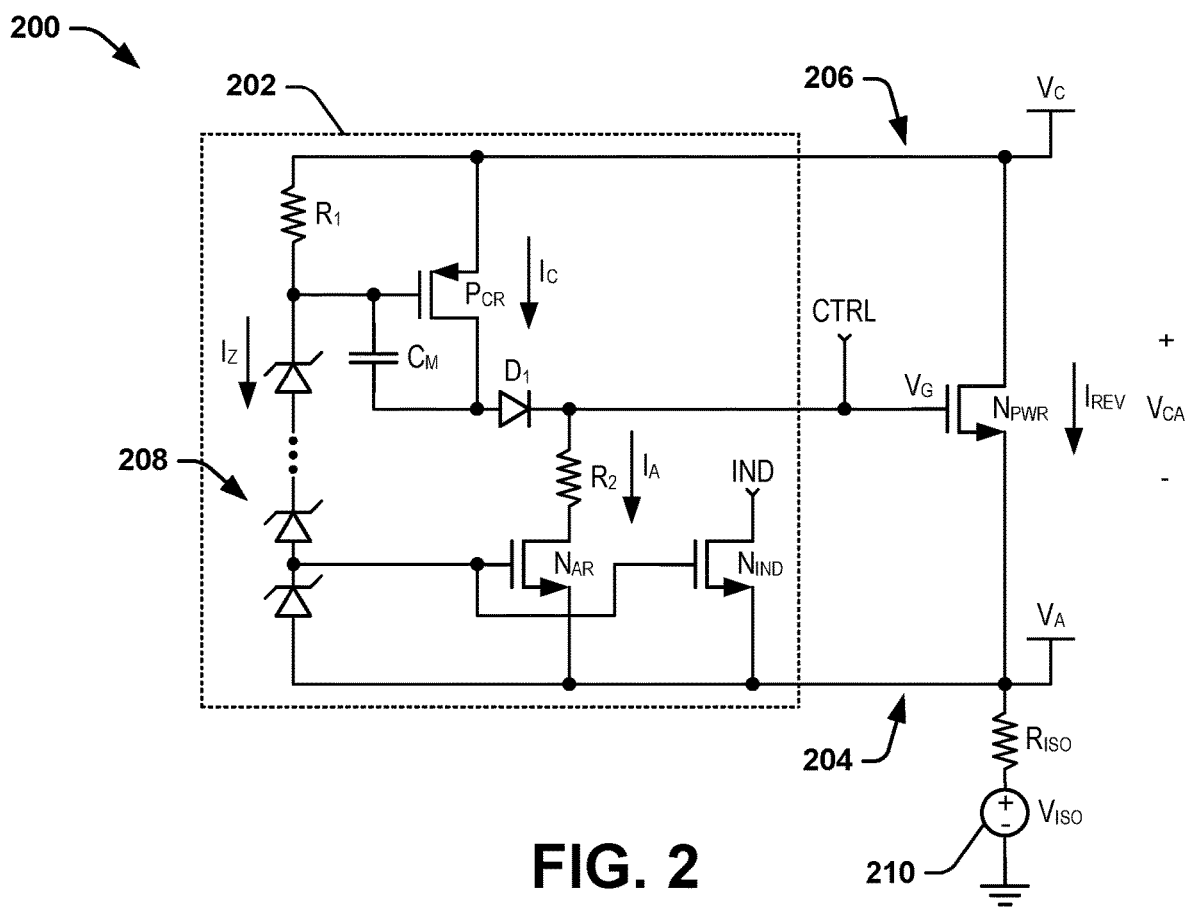
FIG. 2 is an example diagram of a power switch controller circuit.

FIG. 2 is an example block diagram 200 of a reverse current controller 202. The diagram 200 also demonstrates a power transistor, demonstrated in the example of FIG. 2 as an N-FET $N_{PWR}$. The reverse current controller 202 and the power transistor $N_{PWR}$ can be the reverse current controller 114 and the power transistor 106, respectively, in the example of FIG. 1. Therefore, reference is to be made to the example of FIG. 1 in the following description of the example of FIG. 2.

In the example of FIG. 2, the reverse current controller 202 is coupled to a first monitoring terminal 204 and a second monitoring terminal 206. The power transistor $N_{PWR}$ is arranged to have a source coupled the first monitoring terminal 204 and a drain coupled to the second monitoring terminal 206. As described above in the example of FIG. 1, the first and second monitoring terminals 204 and 206 can correspond, respectively, to an anode and a cathode of an ideal diode formed by the power transistor $N_{PWR}$ and the power switch control system 112. Therefore, the first monitoring terminal 204 can have an anode voltage $V_A$ and the second monitoring terminal 206 can have a cathode voltage $V_C$, and the power transistor $N_{PWR}$ can have a reverse voltage $V_{CA}$ across the drain-source, and thus across the cathode to anode.

In the example of FIG. 2, a control signal CTRL is provided to a gate of the power transistor $N_{PWR}$. The control signal CTRL is representative of an activation signal provided from control circuitry (not shown) that is part of the power switch control system 112 to control a voltage $V_G$ at the gate of the power transistor $N_{PWR}$ for operating the power transistor $N_{PWR}$ during normal operation of the power supply system 100. As described herein, the control circuitry is disabled in response to a positive amplitude of the reverse voltage $V_{CA}$, and control of the power transistor $N_{PWR}$ is provided solely by the reverse current controller 202. For example, the control circuitry can include a monitoring circuit that can monitor the amplitude of the voltages $V_A$ and $V_C$, and thus the reverse voltage $V_{CA}$, and can disable the control signal CTRL in response to a positive amplitude of the reverse voltage $V_{CA}$.

In the example of FIG. 2, the reverse current controller 202 includes a resistor $R_1$ coupled to the second monitoring terminal 206 and a Zener diode stack 208 that is arranged between the first monitoring terminal 204 and the resistor $R_1$. As an example, the Zener diode stack 208, combined with the resistor $R_1$, includes a quantity of Zener diodes that can set a desired predetermined threshold amplitude $V_{PT}$ to which the reverse voltage $V_{CA}$ is clamped. The reverse current controller 202 also includes a cathode regulation transistor device, demonstrated as a P-channel FET $P_{CR}$, having a source coupled to the second monitoring terminal 206 and a gate coupled between the resistor $R_1$ and the Zener diode stack 208. The drain of the cathode regulation transistor device $P_{CR}$ is coupled to the gate via a Miller capacitor $C_M$, and is coupled to a gate of the power transistor $N_{PWR}$ via a diode $D_1$. As an example, the Miller capacitor $C_M$ provides compensation for variation in the capacitance $C_{GS}$, transconductance, and gain of the power transistor $N_{PWR}$ given that the power transistor $N_{PWR}$ can be provided as external to the IC that includes the power switch control system 112. The reverse current controller 202 also includes an anode regulation transistor device, demonstrated as an N-FET $N_{AR}$, having a source coupled to the first monitoring terminal 204 and a gate coupled between two of the Zener diodes in the Zener diode stack 208 (e.g., a first and a second Zener diode from the first monitoring terminal 204). The drain of the anode regulation transistor device $N_{AR}$ is coupled to the gate of the power transistor $N_{PWR}$ via a resistor $R_2$.

During normal operation of the power supply system 100, the power transistor $N_{PWR}$ is controlled by the control signal CTRL (e.g., from control circuitry (not shown) in the power switch control system 112). During normal operation, current does not flow from the second monitoring terminal 206 to the first monitoring terminal 204 through the Zener diode stack 208, thereby holding the anode regulation transistor device $N_{AR}$ and the cathode regulation transistor device $P_{CR}$ in a deactivated state. Therefore, the power transistor $N_{PWR}$ is controlled solely by the control signal CTRL. In response to a reverse voltage condition, when the cathode voltage $V_C$ is greater than the anode voltage $V_A$, the control signal CTRL is disabled from controlling the power transistor $N_{PWR}$, thereby ceding control of the power transistor $N_{PWR}$ to the reverse current controller 202. At an amplitude of the reverse voltage $V_{CA}$ that is greater than zero but less than the predetermined threshold amplitude $V_{PT}$, the reverse voltage $V_{CA}$ is insufficient to overcome the breakdown voltage of the Zener diode stack 208. Therefore, no current flows from the second monitoring terminal 206 to the first monitoring terminal 204 through the Zener diode stack 208.

In response to the reverse voltage $V_{CA}$ being approximately equal to the predetermined threshold amplitude $V_{PT}$, and thus approximately equal to the breakdown voltage of the Zener diode stack 208, a current $I_Z$ flows from the second monitoring terminal 206 to the first monitoring terminal 204 through the resistor $R_1$ and the Zener diode stack 208. The current $I_Z$ thus provides a gate-source voltage for each of the anode regulation transistor device $N_{AR}$ and the cathode regulation transistor device $P_{CR}$, thus sufficiently activating each of the anode regulation transistor device $N_{AR}$ and the cathode regulation transistor device $P_{CR}$. The activation of the cathode regulation transistor device $P_{CR}$ provides a current $I_C$ from the second monitoring terminal 206 through the cathode regulation transistor device $P_{CR}$ to the gate of the power transistor $N_{PWR}$ via the diode $D_1$, and the activation of the anode regulation transistor device $N_{AR}$ provides a current $I_A$ from the gate of the power transistor $N_{PWR}$ through the resistor $R_2$ and through the anode regulation transistor device $P_{CR}$ to the first monitoring terminal 204. The amplitudes of the currents $I_A$ and $I_C$ can provide a sufficient amplitude of the voltage $V_G$ to hold the power transistor $N_{PWR}$ in an activated state, thereby conducting the reverse current $I_{REV}$ that flows from the second monitoring terminal 206 to the first monitoring terminal 204.

Nominally, the amplitude of the currents $I_A$ and $I_C$ can be approximately equal. However, the amplitude of the currents $I_A$ and $I_C$ can be adjusted based on changes to the amplitude of the respective voltages $V_A$ and $V_C$. Thus, as described herein, the operation of the cathode regulation transistor device $P_{CR}$ and the anode regulation transistor device $N_{AR}$ with respect to controlling the gate of the power transistor $N_{PWR}$ via the voltage $V_G$ can operate with negative feedback to maintain the reverse voltage $V_{CA}$ at approximately the predetermined threshold amplitude $V_{PT}$. In the example of FIG. 2, a voltage source 210 is demonstrated as coupled to the first monitoring terminal 204, so a voltage $V_{ISO}$ is provided to the first monitoring terminal 204 through a resistor $R_{ISO}$. The voltage $V_{ISO}$ is intended to demonstrate variations that can occur to the voltage $V_{CA}$ (e.g., a change to the voltage $V_A$ or to the voltage $V_C$) during a reverse voltage condition (e.g., while the power transistor $N_{PWR}$ is activated to conduct the reverse current $I_{REV}$), such as resulting from active circuit components in the input stage 102 or the output stage 104 of the power supply system 100.

An increase in the amplitude of the voltage $V_A$ (as modeled by an increase in the voltage $V_{ISO}$) during a reverse voltage condition, and thus a decrease in the amplitude of the reverse voltage $V_{CA}$, results in the gate-source voltage $V_{GS}$ of the cathode regulation transistor device $P_{CR}$ decreasing based on a change in the voltage across the resistor $R_1$. As a result of the decrease of the gate-source voltage $V_{GS}$ of the cathode regulation transistor device $P_{CR}$, the activation of the cathode regulation transistor device $P_{CR}$ (e.g., in the saturation mode) changes to increase the amplitude of the current $I_C$ flowing through the cathode regulation transistor device $P_{CR}$ and to the gate of the power transistor $N_{PWR}$. In response, the increase in the amplitude of the current $I_C$ relative to the current $I_A$ results in an increase of the gate voltage $V_G$ of the power transistor $N_{PWR}$. Accordingly, the activation of the power transistor $N_{PWR}$ (e.g., in the saturation mode) changes to conduct a greater amplitude of the reverse current $I_{REV}$, thereby increasing the reverse voltage $V_{CA}$ to approximately the predetermined threshold amplitude $V_{PT}$, and thus the Zener breakdown voltage of the Zener diode stack 208, in a reverse feedback manner.

Similarly, a decrease in the amplitude of the voltage $V_A$ (as modeled by a decrease in the voltage $V_{ISO}$) during a reverse voltage condition, and thus an increase in the amplitude of the reverse voltage $V_{CA}$, results in the gate-source voltage $V_{GS}$ of the cathode regulation transistor device $P_{CR}$ increasing based on a change in the voltage across the resistor $R_1$. As a result of the increase of the gate-source voltage $V_{GS}$ of the cathode regulation transistor device $P_{CR}$, the activation of the cathode regulation transistor device $P_{CR}$ (e.g., in the saturation mode) changes to decrease the amplitude of the current $I_A$ flowing through the cathode regulation transistor device $P_{CR}$ and to the gate of the power transistor $N_{PWR}$. In response, the decrease in the amplitude of the current $I_A$ relative to the current $I_C$ results in a decrease of the gate voltage $V_G$ of the power transistor $N_{PWR}$. Accordingly, the activation of the power transistor $N_{PWR}$ (e.g., in the saturation mode) changes to conduct a lesser amplitude of the reverse current $I_{REV}$, thereby decreasing the reverse voltage $V_{CA}$ to approximately the predetermined threshold amplitude $V_{PT}$, and thus the Zener breakdown voltage of the Zener diode stack 208, in a reverse feedback manner.

In the example of FIG. 2, the reverse current controller 202 also includes an indicator switch, demonstrated as an N-FET $N_{IND}$. The indicator switch $N_{IND}$ has a gate coupled to the gate of the anode regulation transistor device $N_{AR}$, a source coupled to the first monitoring terminal 204, and a drain that can be coupled to a separate indication circuit (not shown) to provide a signal IND. Thus, the indicator switch $N_{IND}$ is activated in response to the reverse voltage $V_{CA}$ being approximately equal to the predetermined threshold amplitude $V_{PT}$ to indicate clamping of the reverse voltage $V_{CA}$ (e.g., to monitoring circuitry that can be included in the associated IC or an external circuit). The signal IND can therefore provide indication of the clamping of the reverse voltage $V_{CA}$ to other circuitry, such as to post fault information or to enable additional controls.

As described above, in response to changes to an increase in the amplitude of the voltage $V_C$ or a decrease in the amplitude of the voltage $V_A$, the cathode regulation transistor device $P_{CR}$ and the anode regulation transistor device $N_{AR}$ can adjust the control of the power transistor $N_{PWR}$ to adjust the amplitude of the reverse current $I_{REV}$ to maintain clamping of the voltage $V_{CA}$ at the predetermined threshold amplitude $V_{PT}$. Accordingly, the reverse current $I_{REV}$ can be maintained at an amplitude that is sufficiently low to substantially mitigate damage to the power transistor $N_{PWR}$ and/or other circuit components in the input stage 102. Also, the reverse current controller 202 operates based on the voltages $V_A$ and $V_C$, with no need for any additional power or bias signals provided.

Figure 3:
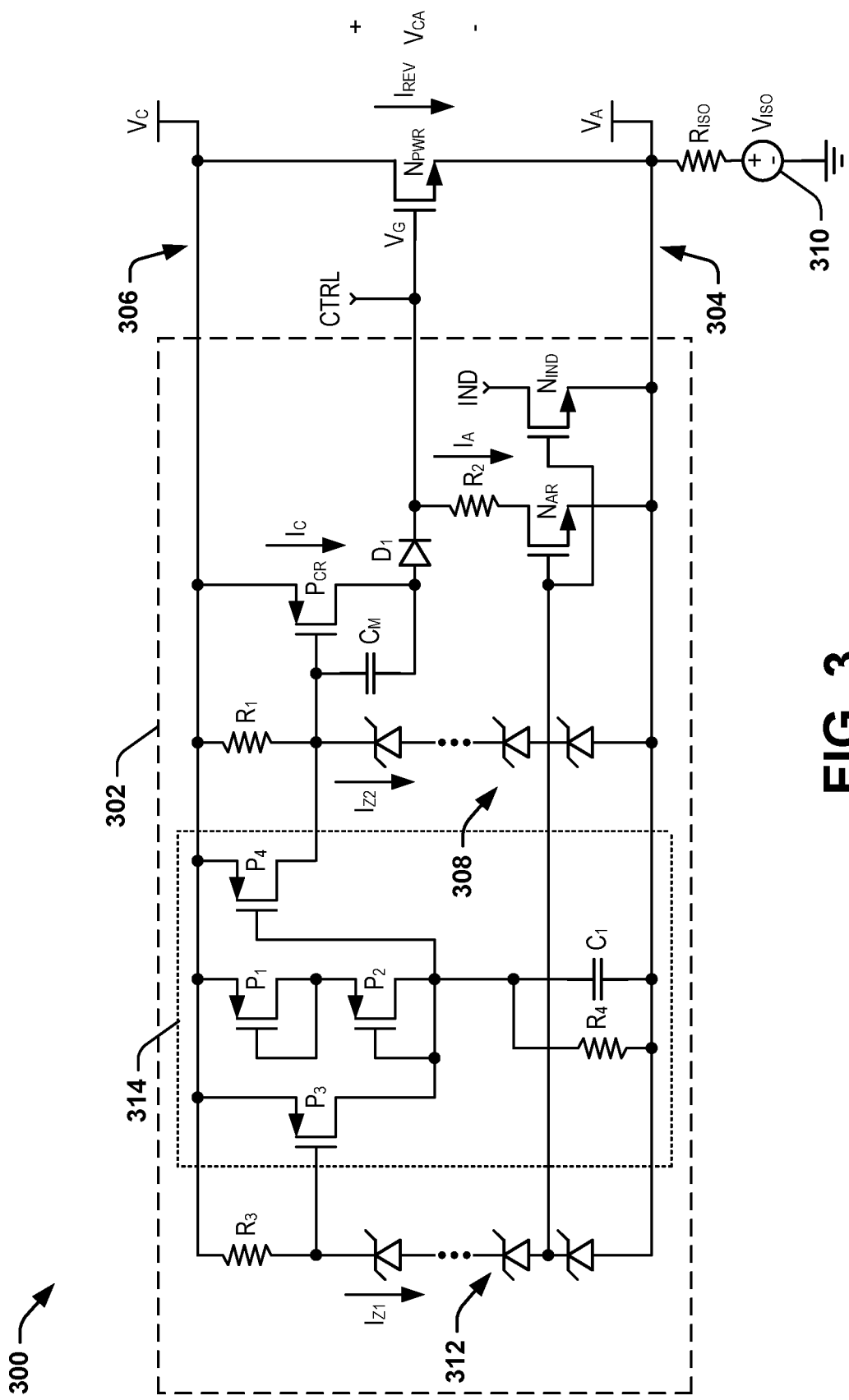
FIG. 3 is another example diagram of a power switch controller circuit.

FIG. 3 is an example block diagram 300 of a reverse current controller 302. The diagram 300 also demonstrates a power transistor, demonstrated in the example of FIG. 3 as an N-FET $N_{PWR}$. The reverse current controller 302 and the power transistor $N_{PWR}$ can be the reverse current controller 114 and the power transistor 106, respectively, in the example of FIG. 1. Therefore, reference is to be made to the example of FIG. 1 in the following description of the example of FIG. 3.

The reverse current controller 302 is arranged similar to the reverse current controller 202 in the example of FIG. 2. In the example of FIG. 3, the reverse current controller 302 is coupled to a first monitoring terminal 304 and a second monitoring terminal 306. The power transistor $N_{PWR}$ is arranged to have a source coupled the first monitoring terminal 304, having an anode voltage $V_A$, and a drain coupled to the second monitoring terminal 306 to correspond, respectively, to an anode and a cathode, having a cathode voltage $V_C$, of an ideal diode formed by the power transistor $N_{PWR}$ and the power switch control system 112. A control signal CTRL representative of an activation signal provided from control circuitry (not shown) is provided to a gate of the power transistor $N_{PWR}$ to control a voltage $V_G$ at the gate of the power transistor $N_{PWR}$ for operating the power transistor $N_{PWR}$ during normal operation of the power supply system 100.

In the example of FIG. 3, the reverse current controller 302 includes a resistor $R_1$ coupled to the second monitoring terminal 306 and a first Zener diode stack 308 that is arranged between the first monitoring terminal 304 and the resistor $R_1$. As an example, the first Zener diode stack 308 includes a quantity of Zener diodes that can, combined with the resistor $R_1$, set a desired first predetermined threshold amplitude $V_{PT1}$ to which the reverse voltage $V_{CA}$ is clamped. The reverse current controller 302 also includes a cathode regulation transistor device $P_{CR}$ having a source coupled to the second monitoring terminal 306 and a gate coupled between the resistor $R_1$ and the first Zener diode stack 308. The drain of the cathode regulation transistor device $P_{CR}$ is coupled to the gate via a Miller capacitor $C_M$, and is coupled to a gate of the power transistor $N_{PWR}$ via a diode $D_1$. The reverse current controller 302 also includes an anode regulation transistor device $N_{AR}$, having a source coupled to the first monitoring terminal 304. The drain of the anode regulation transistor device $N_{AR}$ is coupled to the gate of the power transistor $N_{PWR}$ via a resistor $R_2$.

In the example of FIG. 3, the reverse current controller 302 also includes a resistor $R_3$ coupled to the second monitoring terminal 306 and a second Zener diode stack 312 that is arranged between the first monitoring terminal 304 and the resistor $R_3$. As an example, the second Zener diode stack 312 includes a quantity of Zener diodes that can, combined with the resistor $R_3$, set a desired second predetermined threshold amplitude $V_{PT2}$ that is less than the first predetermined threshold amplitude $V_{PT1}$. For example, the second Zener diode stack 312 can include one fewer Zener diode than the first Zener diode stack 308. In the example of FIG. 3, the gate of the anode regulation transistor device $N_{AR}$ is coupled between two of the Zener diodes in the second Zener diode stack 312 (e.g., a first and a second Zener diode from the first monitoring terminal 304). The reverse current controller 302 also includes an indicator switch, demonstrated as an N-FET $N_{IND}$. The indicator switch $N_{IND}$ has a gate coupled to the gate of the anode regulation transistor device $N_{AR}$, a source coupled to the first monitoring terminal 304, and a drain that can be coupled to a separate indication circuit (not shown) to provide a signal IND.

The reverse current controller 302 also includes a safety circuit 314 that is coupled between the first and second Zener diode stacks 308 and 312. The safety circuit 314 is configured to control a relative time of activation of the anode regulation transistor device $N_{AR}$ and the cathode regulation transistor device $P_{CR}$. As an example, the cathode regulation transistor device $P_{CR}$ can exhibit spurious activation in response to a transient in the voltage $V_C$ based on the gate of the cathode regulation transistor device $P_{CR}$ not tracking the voltage $V_C$. The arrangement of the capacitor $C_M$ between the gate and the drain of the cathode regulation transistor device $P_{CR}$ can result in activation of the cathode regulation transistor device $P_{CR}$, even if the drain-source voltage of the cathode regulation transistor device $P_{CR}$ is less than the threshold. Thus, as described herein, the safety circuit 314 can hold the cathode regulation transistor device $P_{CR}$ in a deactivated state until the reverse voltage $V_{CA}$ is approximately equal to the second predetermined threshold amplitude $V_{PT2}$.

In the example of FIG. 3, the safety circuit 314 includes a first P-FET $P_1$ and a second P-FET $P_2$ that are arranged as diode-connected (e.g., with drain and gate coupled to each other). The diode-connected P-FETs $P_1$ and $P_2$ provide for a third predetermined threshold amplitude $V_{PT3}$ that is approximately two diode-drops in voltage from the voltage $V_C$. The first P-FET $P_1$ is coupled at the source to the second monitoring terminal 306 and the second P-FET $P_2$ is coupled at the source to the drain and gate of the first P-FET $P_1$. The second P-FET $P_2$ is coupled at the drain and gate to a parallel connection of a resistor $R_4$ and a capacitor C1 that are each also coupled to the first monitoring terminal 304. The safety circuit 314 also includes a third P-FET $P_3$ that is coupled at a source to the second monitoring terminal 306 and at a drain to the gate and drain of the second P-FET $P_2$. The third P-FET $P_3$ has a gate that is coupled between the resistor $R_3$ and the second Zener diode stack 312. The safety circuit 314 further includes a fourth P-FET $P_4$ that is coupled at a source to the second monitoring terminal 306 and at a drain to the gate of the cathode regulation transistor device $P_{CR}$. The gate of the fourth P-FET $P_4$ is coupled to the gate and drain of the second P-FET $P_2$.

Similar to as described above in the example of FIG. 2, the power transistor $N_{PWR}$ is controlled by the control signal CTRL (e.g., from control circuitry (not shown) in the power switch control system 112) during normal operation of the power supply system 100. However, in response to the reverse voltage $V_{CA}$ being approximately equal to the third predetermined threshold amplitude $V_{PT3}$ (e.g., approximately two diode-drops in voltage from the voltage $V_C$ as set by the P-FETs $P_1$ and $P_2$ in the safety circuit 314) the safety circuit 314 activates the P-FET $P_4$ to hold the cathode regulation transistor device $P_{CR}$ in a deactivated state. For example, the amplitude of the third predetermined amplitude $V_{PT3}$ across the P-FETs $P_1$ and $P_2$ relative to the voltage $V_C$ is sufficient to activate the P-FET $P_4$, thus pulling the gate of the cathode regulation transistor device $P_{CR}$ to be approximately equal to the voltage $V_C$. Therefore, the safety circuit 314 can mitigate spurious activation of the cathode regulation transistor device $P_{CR}$ from a transient in the voltage $V_C$ during the reverse voltage event.

In response to the reverse voltage $V_{CA}$ being approximately equal to the second predetermined threshold amplitude $V_{PT2}$, such as set by the second Zener diode stack 312, a current $I_{Z1}$ flows from the second monitoring terminal 306 to the first monitoring terminal 304 through the resistor $R_3$ and the second Zener diode stack 312. The current $I_{Z1}$ thus provides a gate-source voltage for the anode regulation transistor device $N_{AR}$ and the P-FET $P_3$, thus sufficiently activating each of the anode regulation transistor device $N_{AR}$ and the P-FET $P_3$. The activation of the P-FET $P_3$ pulls up the gate voltage of the P-FET $P_4$ to approximately the voltage $V_C$, thereby deactivating the P-FET $P_4$. As a result, the safety circuit 314 is disabled, and no longer holds the cathode regulation transistor device $P_{CR}$ in the deactivated state. The activation of the anode regulation transistor device $N_{AR}$ provides a current $I_A$ from the gate of the power transistor $N_{PWR}$ through the resistor $R_2$ and through the anode regulation transistor device $P_{CR}$ to the first monitoring terminal 304. The amplitude of the current $I_A$ therefore holds the power transistor $N_{PWR}$ in the deactivated state when the reverse voltage $V_{CA}$ is greater than the second predetermined threshold amplitude $V_{PT2}$ and less than the first predetermined threshold amplitude $V_{PT1}$.

In response to the reverse voltage $V_{CA}$ being approximately equal to the first predetermined threshold amplitude $V_{PT1}$, and thus approximately equal to the breakdown voltage of the Zener diode stack 308, a current $I_{Z2}$ flows from the second monitoring terminal 306 to the first monitoring terminal 304 through the resistor $R_1$ and the Zener diode stack 308. The current $I_{Z2}$ thus provides a gate-source voltage for the cathode regulation transistor device $P_{CR}$ which is no longer held in a deactivated state by the safety circuit 314, thus sufficiently activating the cathode regulation transistor device $P_{CR}$. The activation of the cathode regulation transistor device $P_{CR}$ provides a current $I_C$ from the second monitoring terminal 306 through the cathode regulation transistor device $P_{CR}$ to the gate of the power transistor $N_{PWR}$ via the diode $D_1$. The amplitudes of the currents $I_A$ and $I_C$ can provide a sufficient amplitude of the voltage $V_G$ to hold the power transistor $N_{PWR}$ in an activated state, thereby conducting the reverse current $I_{REV}$ that flows from the second monitoring terminal 306 to the first monitoring terminal 304, similar to as described above in the example of FIG. 2.

The reverse current controller 302 can thus clamp the voltage $V_{CA}$ to the first predetermined threshold amplitude $V_{PT1}$, even with transient changes to the voltages $V_A$ and $V_C$ (e.g., as modeled by the voltage $V_{ISO}$ from a voltage source 310 through a resistor $R_{ISO}$) in a reverse feedback manner as described above in the example of FIG. 2. However, by implementing the second Zener diode stack 312 and the safety circuit 314, the operation of the reverse current controller 302 can provide for sequential operation of the anode regulation transistor device $N_{AR}$ and the cathode regulation transistor device $P_{CR}$ to mitigate spurious activation of the cathode regulation transistor device $P_{CR}$ in response to transient changes to the voltage $V_C$.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A reverse current controller, comprising:
   first and second monitoring terminals adapted to be coupled to respective first and second terminals of a power transistor are configured with a power switch as an ideal diode between the first monitoring terminal and the second monitoring terminal;
   a control output adapted to be coupled to a control input of the power transistor;
   an anode regulation transistor coupled between an input of the power transistor and the first monitoring terminal, the anode regulation transistor being activated in response to a reverse voltage being approximately equal to a threshold amplitude;
   a cathode regulation transistor coupled between the input of the power transistor and the second monitoring terminal, wherein the cathode regulation transistor is activated in response to the reverse voltage being approximately equal to the threshold amplitude; and
   a Zener diode stack coupled to an input of the anode regulation transistor and an input of the cathode regulation transistor, wherein the Zener diode stack is configured to set the threshold amplitude, and to activate the anode regulation transistor and the cathode regulation transistor in response to the reverse voltage being approximately equal to the threshold amplitude;
   wherein the reverse current controller is configured to provide a control signal at the control output to activate the power transistor to conduct a reverse current from the second monitoring terminal to the first monitoring terminal responsive to a reverse voltage associated with a voltage at the second monitoring terminal exceeding a voltage at the first monitoring terminal by the threshold amplitude.

2. The reverse current controller of claim 1, wherein the reverse current controller is configured to clamp the reverse voltage to the threshold amplitude to conduct the reverse current in response to the reverse voltage being approximately equal to the threshold amplitude.

3. The reverse current controller of claim 1, further comprising an indicator switch that is coupled to the Zener diode stack, and configured to activate in response to the reverse voltage being approximately equal to the threshold amplitude.

4. The reverse current controller of claim 1, wherein the reverse current is a first reverse current, the anode regulation transistor and the cathode regulation transistor are activated by the Zener diode stack in response to the reverse voltage being approximately equal to the threshold amplitude to conduct a second reverse current from the second monitoring terminal to the first monitoring terminal, and the second reverse current providing an activation voltage for the power transistor to conduct the first reverse current through the power transistor.

5. The reverse current controller of claim 4, wherein the first reverse current is controlled by the power transistor, and the second reverse current is controlled by the anode regulation transistor and the cathode regulation transistor to clamp the reverse voltage at approximately the threshold amplitude.

6. The reverse current controller of claim 1, wherein the Zener diode stack is a first Zener diode stack configured to set the threshold amplitude as a first threshold amplitude, the reverse current controller further comprising:
   a second Zener diode stack arranged in parallel with the first Zener diode stack, the second Zener diode stack being configured to set a second threshold amplitude, the second threshold amplitude being less than the first threshold amplitude; and
   a safety circuit coupled to the second Zener diode stack, the safety circuit being configured to control a relative time of activation associated with the anode regulation transistor and the cathode regulation transistor in response to the reverse voltage being approximately equal to the second threshold amplitude.

7. The reverse current controller of claim 6, wherein:
   the safety circuit includes at least one diode configured to set a third threshold amplitude that is less than the second threshold amplitude;
   the safety circuit is configured to hold the anode regulation transistor in a deactivated state in response to the reverse voltage being approximately equal to the third threshold amplitude and less than the second threshold amplitude; and
   the safety circuit is configured to activate the anode regulation transistor in response to the reverse voltage being approximately equal to the second threshold amplitude.

8. The reverse current controller of claim 6, wherein the reverse current controller includes an indicator switch coupled to the second Zener diode stack, wherein the indicator switch is activated in response to the reverse voltage being approximately equal to the threshold amplitude.

9. A power supply system comprising:
   an input stage configured to provide a power current in response to an input voltage;
   an output stage configured to provide the power current to a load;
   a power transistor coupled between the input stage and the output stage;
   a power switch control system configured to control the power transistor, the power switch control system comprising:

a first monitoring terminal coupled to a first terminal of the power transistor;

a second monitoring terminal coupled to a second terminal of the power transistor, wherein the power transistor and the power switch control system form an ideal diode between the first monitoring terminal and the second monitoring terminal, in which the first monitoring terminal is configured as an anode of the ideal diode and the second monitoring terminal is configured as a cathode of the ideal diode; and a reverse current controller coupled to the first monitoring terminal and the second monitoring terminal and being configured to control activation of the power transistor in response to a reverse voltage at the second monitoring terminal being greater than a voltage at the first monitoring terminal, the reverse current controller including:

an anode regulation transistor coupled between an input of the power transistor and the first monitoring terminal, the anode regulation transistor being activated in response to the reverse voltage being approximately equal to a threshold amplitude;

a cathode regulation transistor coupled between the input of the power transistor and the second monitoring terminal, the cathode regulation transistor being activated in response to the reverse voltage being approximately equal to the threshold amplitude; and a Zener diode stack coupled to an input of the anode regulation transistor and an input of the cathode regulation transistor, the Zener diode stack being configured to set the threshold amplitude, and to activate the anode regulation transistor and the cathode regulation transistor in response to the reverse voltage being approximately equal to the threshold amplitude, causing a reverse current to flow.

10. The system of claim 9, wherein the reverse current controller is configured to clamp the reverse voltage to the threshold amplitude.

11. The system of claim 9, wherein the reverse current is a first reverse current, wherein the anode regulation transistor and the cathode regulation transistor are activated by the Zener diode stack in response to the reverse voltage being approximately equal to the threshold amplitude to conduct a second reverse current from the second monitoring terminal to the first monitoring terminal, the second reverse current providing an activation voltage for the power transistor to conduct the first reverse current through the power transistor.

12. The system of claim 11, wherein the first reverse current is controlled by the power transistor, and the second reverse current is controlled by the anode regulation transistor and the cathode regulation transistor to clamp the reverse voltage at approximately the threshold amplitude.

13. The system of claim 9, wherein the Zener diode stack is a first Zener diode stack configured to set the threshold amplitude as a first threshold amplitude, the system further comprising:

a second Zener diode stack arranged in parallel with the first Zener diode stack, wherein the second Zener diode stack is configured to set a second threshold amplitude that is less than the first threshold amplitude; and a safety circuit coupled to the second Zener diode stack, wherein the safety circuit is configured to control a relative time of activation of the anode regulation transistor and the cathode regulation transistor in response to the reverse voltage being approximately equal to the second threshold amplitude.

14. The system of claim 11, wherein the safety circuit comprises at least one diode configured to set a third threshold amplitude that is less than the second threshold amplitude, the safety circuit is configured to hold the anode regulation transistor in a deactivated state in response to the reverse voltage being approximately equal to the third threshold amplitude and less than the second threshold amplitude, and the safety circuit is configured to activate the anode regulation transistor in response to the reverse voltage being approximately equal to the second threshold amplitude.

15. An integrated circuit (IC) comprising:

a Zener diode stack having an input coupled to a first monitoring terminal and an output coupled to a second monitoring terminal, the first and second monitoring terminals being coupled to receive a first terminal of a power transistor and a second terminal of the power transistor, respectively;

an anode regulation transistor having an input coupled to the Zener diode stack, having a first terminal coupled to the first monitoring terminal and a second terminal coupled to receive an input of the power transistor; and a cathode regulation transistor having an input coupled to the Zener diode stack, having a first terminal coupled to receive the input of the power transistor and a second terminal coupled to the second monitoring terminal.

16. The IC of claim 15, wherein the power transistor is configured to conduct a first reverse current from the first monitoring terminal to the second monitoring terminal in response to a reverse voltage arranged as a cathode voltage at the second monitoring terminal being greater than an anode voltage at the first monitoring terminal, wherein the anode regulation transistor and the cathode regulation transistor are activated by the Zener diode stack in response to the reverse voltage being approximately equal to a threshold amplitude set by the Zener diode stack to conduct a second reverse current from the second monitoring terminal to the first monitoring terminal, the second reverse current providing an activation voltage for the power transistor to conduct the first reverse current through the power transistor.

17. The IC of claim 16, wherein the first reverse current is controlled by the power transistor and the second reverse current is controlled by the anode regulation transistor and the cathode regulation transistor to clamp the reverse voltage at approximately the threshold amplitude.

18. The IC of claim 16, wherein the Zener diode stack is a first Zener diode stack configured to set the threshold amplitude as a first threshold amplitude, the IC further comprising:

a second Zener diode stack arranged in parallel with the first Zener diode stack, the second Zener diode stack being configured to set a second threshold amplitude, the second threshold amplitude being less than the first threshold amplitude; and a safety circuit coupled to the second Zener diode stack, the safety circuit being configured to control a relative time of activation associated with the anode regulation transistor and the cathode regulation transistor in response to the reverse voltage being approximately equal to the second threshold amplitude.

* * * * *